July 19, 1960 R. L. MIDKIFF 2,945,950

BALANCED PHASE SENSING CIRCUITRY

Filed Oct. 14, 1958

INVENTOR.
RAYMOND L. MIDKIFF.
BY Alden D. Redfield.
Irvin P. Garfinkle
ATTORNEYS.

United States Patent Office 2,945,950

Patented July 19, 1960

2,945,950

BALANCED PHASE SENSING CIRCUITRY

Raymond L. Midkiff, Hamilton, Ohio, assignor to Avco Manufacturing Corporation, Cincinnati, Ohio, a corporation of Delaware Filed Oct. 14, 1958, Ser. No. 767,122

6 Claims. (Cl. 250—27)

This invention relates generally to balanced diode types of phase sensitive circuits and, more particularly, to a high impedance phase sensitive detector incorporating passive amplifying elements.

It is known that a conventional balanced diode type of phase sensitive circuit can be used either as a modulator or as a phase detector. Several well known circuits of this type are illustrated in Radio Engineer's Handbook, Frederick Emmons Terman, McGraw-Hill Book Company, Inc., 1943, page 553. In modulator operation, the carrier frequently signal acts essentially as essentially as a high frequency switch for the relatively much smaller modulating frequency signal, and the resulting output voltage contains the two side bands with carrier frequency suppressed. In phase detector operation, the carrier and the modulator are of the same frequency. When the phase of the carrier frequency is the same as the phase of the modulator frequency, no output results; however, as the carrier and modulator frequency signals become out of phase, a direct current output is obtained in either positive or negative polarity, depending upon which signal is leading or lagging in phase.

The prior art circuit serves as an economical and satisfactory phase sensitive detector for many applications. Its major disadvantage, however, is its normally low operating impedance, which means that high impedance drivers cannot be employed without impedance matching devices and the attendant step-down in voltage and increase in insertion losses. For many applications, one or more stages of direct current amplification may be required to achieve the necessary voltage outputs and, as is known, such arrangements are costly in space and money, and direct current amplifiers raise serious problems of stability.

By means of this invention, the impedance of the conventional balanced diode types of phase sensitive detector is increased to the extent that a high impedance driver stage can be more efficiently matched to the circuit and, at the same time, passive means are provided for amplifying the voltage output.

Briefly, this invention contemplates the insertion of a zener diode in each of at least two legs of the conventional balanced diode type circuit. By insertion of the zener diodes in a direction opposite to the usual switching diodes, there is produced an increase in input impedance of from a few hundred ohms to several thousand ohms, depending upon the various types of diodes used. This permits the use of a driver stage having a higher impedance and a correspondingly higher driving voltage, thus producing a much larger direct voltage output. In addition, the efficiency of the system is improved because coupling losses are reduced; and efficiency is improved still further because the zener diodes conduct during only a small portion of the conduction cycle, and thus expend a very small amount of power. Moreover, the zener diodes function as passive amplifying elements to raise the output voltage still higher.

It is, therefore, the primary object of this invention to modify with simple passive elements the conventional balanced diode type of phase sensitive detector circuit by increasing its input impedance with minimum loss of efficiency and simultaneously producing increased output voltages.

Another object of this invention is to provide voltage gain in a balanced diode type of phase sensitive detector by means of passive amplifying elements.

Another object of this invention is to increase the impedance of a conventional balanced diode type of phase sensitive detector circuit by inserting in each of the conducting paths thereof a variable impedance device having characteristics such that its impedance to normal conductivity of current is relatively high until said current exceeds a predetermined value, after which the impedance is relatively low.

Still another object of this invention is to increase the impedance of a balanced diode type of phase sensitive detector circuit by inserting into each of the conduction paths thereof a zener diode connected in opposite polarity to the normal conductivity of its respective conducting path.

For a more complete understanding of the nature and further objects of this invention, reference should now be made to the following detailed description and to the accompanying drawings, in which.

Figures 1, 2, 3, 4, 5, 6:
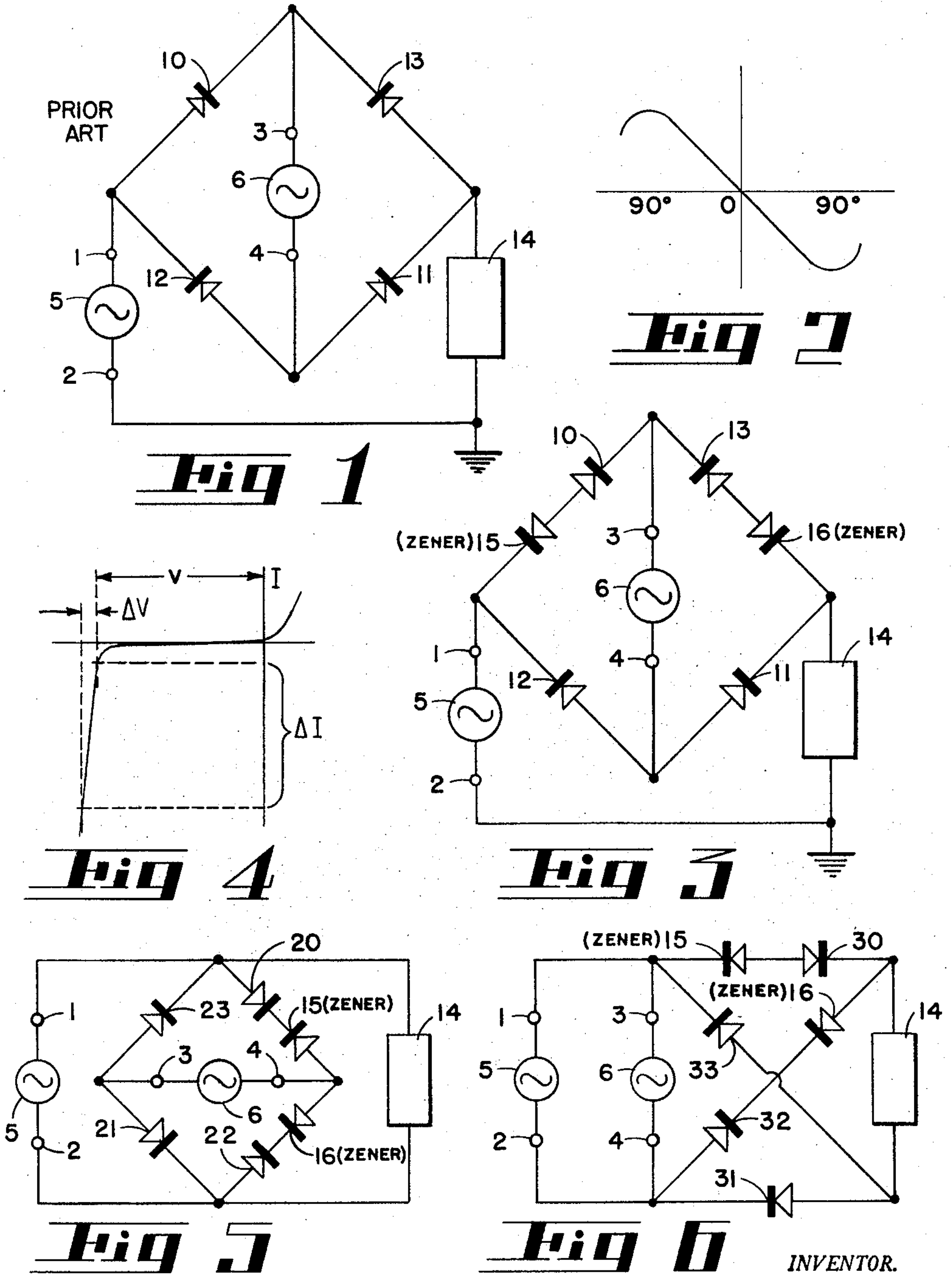
Fig. 1 represents a prior art balanced diode type of phase sensitive detector.
Fig. 2 is a curve representing the output voltage derived from a balanced diode type of phase sensitive detector.
Fig. 3 illustrates a phase sensitive detector made in accordance with this invention.
Fig. 4 illustrates the operation of the zener diodes employed in accordance with this invention.
Figs. 5 and 6 illustrate modified embodiments of this invention.

The prior art balanced diode type of phase sensitive detector circuit illustrated in Fig. 1 is comprised of four semi-conductor elements, such as copper oxide, silicon, or other type of diode rectifiers 10 to 13, connected as illustrated and having two input circuits at terminals 1 and 2, and 3 and 4, respectively. In accordance with established principles (see Radio Engineers' Handbook, supra) modulation or phase detection is accomplished by simultaneously applying two signal sources 5 and 6 to the respective input terminals, and the output is derived across a load 14.

In modulator operation as disclosed in "Radio Engineers' Handbook," the source 5 of modulating frequency signals is applied to terminals 1 and 2, and a much larger source 6 of carrier frequency signals is applied across terminals 3 and 4. The much larger carrier frequency source 6 acts essentially as a high frequency switch, causing the individual diode rectifiers 10 to 13 to conduct or fail to conduct the modulating frequency signals, according to the instantaneous polarity of the applied frequency. That is to say, in the operation of the prior art types of circuit, as illustrated in Fig. 1, a negative voltage at terminal 3 and a positive voltage at terminal 4 permit conduction of each of the diodes 10 to 13; and, thus, a circuit in one direction is completed from the modulating signal source 5 through the diode 10, the carrier signal source 6, the diode 11 and the load 14, and in the opposite direction through the load 14, the diode 13, the carrier signal source 6, the diode 12 and the modulating signal source 5. Of course, for other applications the signal sources may be of equal amplitude, or either one of the signals may be the larger one. It will also be understood that the prior art modulator is limited to operation in a relatively low range of frequencies.

When the prior art circuit is used as a phase detector, the voltages at sources 5 and 6 are of essentially the same frequency, and a direct current output voltage is developed across load 14 when a phase difference exists, i.e., when one signal leads or lags the other. When the voltage on terminal 1 is 90 degrees out of phase with the voltage on terminal 3, a maximum direct current output voltage is obtained, either positive or negative, depending upon the leading or lagging phase difference of the voltages. A plot of the direct current output voltage vs. phase differences of the signals results in a curve, as illustrated in Fig. 2.

As previously noted, the major disadvantage of the prior art balanced diode type of phase sensitive detector circuit is its normally low operating impedance, which renders it unsatisfactory for many applications as a phase detector. By inserting a zener diode into each of the conducting paths of the prior art phase sensitive detector, the impedance of the detector is raised, and far greater output voltages are achieved than were previously possible without additional amplifier stages. In Fig. 3 this is accomplished by placing zener diodes 15 and 16 in the reverse direction in the legs of the circuit containing the diodes 10 and 13, respectively.

It will be noted that both conducting paths of the circuit now contain a reversely connected zener diode; that is to say, the zener diode 15 is reversely connected in the conducting path from the source 5 through the diode 10, the source 6, the diode 11 and the load 14, while the zener diode 16 is reversely connected in the conducting path from the load 14 through the diode 13, the source 6, the diode 12 and the source 5. Since the zener diodes 15 and 16 are connected in the reverse direction, a large increase in circuit impedance is effected. Depending upon the type of copper oxide, silicon or other diode employed and the characteristics of the particular zener diodes, the impedance of the circuit may be increased from a few hundred ohms to several thousand ohms, thus permitting operation of the driver stages with higher voltages and direct coupling of high impedance generators.

Also, because of the zener breakdown characteristics, there is a great increase in efficiency. This increase in efficiency results because the zener diodes, when driven in the reverse direction, conduct only during the portion of the signal cycle after the zener breakdown is reached, and this means that losses due to the zener diode resistance are greatly reduced. An additional increase in efficiency is also realized because efficient impedance matching is achieved and, in certain cases, matching devices may not be required at all.

In addition to providing increased impedance without serious power losses, the zener diodes 15 and 16 serve as passive diode amplifiers to raise the output voltage to a level much higher than that which can be achieved by the prior art circuitry. All of these results will be best understood in connection with Fig. 4, which illustrates the voltage-current characteristics of a typical zener diode.

In the operation of the typical zener diode, such as diodes 15 and 16, a drive signal in the forward direction will produce currents much like those produced by the ordinary copper oxide diode. In the reverse direction, however, the zener diode has essentially infinite impedance until such time as the zener breakdown region is approached. Thus, in Fig. 4, as the drive signal voltage across each of the zener diodes is increased in the reverse direction, only a very small current I flows. However, when the voltage is increased beyond V by an amount ΔV, then the impedance of the zener is reduced to a very low value, and an extremely large current ΔI is produced.

During the portion of the cycle when the drive signal is below the zener breakdown region, the zener diodes 15 and 16 appear as capacitors. Due to this apparent capacitance and the system capacitance, composed of stray capacitance and reflected capacitance, a bias voltage will be developed cross the zener diodes. During the portion of the cycle when the zener voltage is exceeded the zener diodes no longer appear as capacitors, but suddenly appear as variable resistors of relatively low value. A large surge of charging current ΔI results and produces a large voltage across the load. All that is necessary to maintain the charge across the diodes is for the discharge path to have a longer RC time constant than the charging path. This offers no problem, since the discharge path is comprised of the reverse impedance of the switching diodes. Only a small portion of the driving signals are required to maintain the charge across the zener diodes and to produce the large surge in current flow, as is seen from Fig. 4. The gain function may be represented by the equation $$G=\frac{1}{2}\sqrt{\frac{Z_2}{Z_1}}$$

where G represents power gain, $Z_2$ represents the reverse impedance of the diodes 10 to 13, and $Z_1$ represents the forward impedance of the diodes 10 to 13 and the varying impedance of the zener diodes in the reverse conducting region.

Inherently, the disclosed arrangements of the zener diodes in each of the embodiments illustrated tend to insert an impedance transformation element which establishes an essentially constant generator impedance for the device. This impedance is of a much higher order than may be realized from anything described in the prior art.

In a second embodiment of this invention, the zener diodes 15 and 16 may be inserted, as shown in Fig. 5, into each of the conducting paths of a second type of conventional balanced diode type of phase sensitive detector. The operation of this embodiment is similar to the embodiment illustrated in Fig. 3, the major difference being that a short circuit is produced across the load 14 when the diodes 20 to 23 are conductive, whereas in Fig. 3 an open circuit to the load is produced when the diodes 10 to 13 are non-conductive.

In Fig. 5, the zener diode 15 is connected in the conducting path from the source 5 through the diode 20, the source 6 and the diode 21, while the zener diode 16 is connected into the conducting path from the source 5 through the diode 22, the source 6 and the diode 23. Until such time as the zener breakdown voltage is reached, no conduction will occur. After the zener breakdown region is passed, conduction of the diodes results in a short-circuiting of load 14. However, until conduction occurs, the insertion of the zener diodes has the effect of materially raising the impedance of the circuit; and, in addition, the zener diodes serve as passive amplifying elements in a manner similar to that described in connection with Fig. 3.

In a third embodiment of this invention, the zener diodes 15 and 16 are inserted, as shown in Fig. 6, in each of the conducting paths of another conventional balanced diode type of phase sensitive detector. This detector is also similar to that illustrated in Fig. 3, with the exception that the diodes 30 to 33 operate by reversing the direction of the signal sources 5 and 6 every half-cycle. In this embodiment, the zener diode 15 is connected in the conducting path from the sources 5 and 6 through diode 30, load 14 and diode 31, while the zener diode 16 is connected in the conducting path from the sources 5 and 6 through the diode 32, the load 14 and the diode 33. As in the previous embodiment, conduction will not occur in any of the diodes until after the zener breakdown region of diodes 15 and 16 is passed. As before, this has the effect of raising the impedance of the circuit, increasing its efficiency, and serving as a passive amplifying element; it will be noted, however, that Fig. 5 does not find utility as a phase detector, but only as a modulator, since the voltage on load 14 will always be of one polarity.

Each of the above-described circuits results in considerable savings in both cost and space requirements. By incorporating only two small zener diodes, the relatively low output voltage of the conventional balanced diode type of phase sensitive detector is considerably increased and its efficiency is greatly improved, far out of proportion to the cost of the added parts. It is to be noted, however, that care must be exercised in the selection of all of the diodes used, and it is particularly important that the zener diodes be closely matched. Otherwise, unmatched zeners will produce a residual voltage so that a zero output voltage is not obtained when the two driving signals at sources 5 and 6 are of the same frequency and phase.

The detector illustrated in Fig. 3 was actually reduced to practice and successfully used in an automatic frequency control network where the operating frequency and phase was compared with a reference frequency generated by a crystal oscillator. The output voltage produced was 33 volts, peak to peak, and was developed into a 56K ohm load using two 30-volt zener diodes, i.e., zener diodes in which the zener breakdown voltage occurred at approximately 30 volts. This represented a voltage amplification of 8 to 10 over the conventional balanced diode type of phase sensitive detector using the same driving power.

It is believed that the construction of zener diodes is well known in the art and need not be described further for the purpose of this patent application. It suffices to point out that a zener diode is normally a semi-conductor having low impedance to normal current flow but high impedance to reverse current flow until the reverse current reaches a predetermined magnitude, after which the impedance is rendered relatively low. Broadly, a reverse current sufficient to cause the breakdown in impedance is referred to as a zener current. The field required to excite the zener current is the zener voltage. Generally, the zener voltage is associated with that portion of the reverse volt-ampere characteristic of a semi-conductor, wherein the voltage remains substantially constant over an appreciable range of current values. The self-healing breakdown characteristic of a zener diode is considered analogous to a gas discharge tube, and is sometimes referred to as a Townsend discharge or electronic avalanche. The zener characteristics are further defined in The International Dictionary of Physics and Electronics, D. Van Nostrand Company, Inc., 1956, page 1002.

While there are shown three specific embodiments of this invention, many improvements and modifications will at once become apparent to persons skilled in the art. For example, the same techniques may also be applied to the ring bridge modulator type of circuit, as shown in Transistor Circuit Engineering, edited by Richard F. Shea, John Wiley & Sons, Inc., page 145. It is noted, however, that in the ring bridge circuit it will be necessary to connect one zener diode in opposition to each of the switching diodes. It is intended, therefore, that this invention be limited only by the scope of the following claims, as interpreted in the light of the prior art.

What is claimed is:

1. A balanced diode type of phase sensitive detector comprising: a first plurality of impedance elements, said first plurality of impedance elements having operating characteristics such that the impedance to conductivity of current of one polarity is relatively low and the impedance to conductivity of current of an opposite polarity is relatively high; a second plurality of impedance elements, said second plurality of impedance elements having operating characteristics such that the impedance to conductivity of current of said one polarity is relatively high and the impedance to conductivity of current of said opposite polarity is relatively low; a load connected in a first conducting path with said first plurality of impedance elements, and in a second conducting path with said second plurality of impedance elements; non-linear impedance devices connected, respectively, in said first and second conducting paths, said non-linear impedance device in said first conducting path comprising a diode amplifier having operating characteristics such that impedance is relatively high to conductivity of current of said one polarity until said current exceeds a predetermined value, after which its impedance is relatively low, said non-linear impedance device in said second conducting path comprising a diode amplifier having operating characteristics such that impedance is relatively high to conductivity of current of said opposite polarity until said current exceeds a predetermined value, after which its impedance is relatively low.

2. In a balanced diode type of phase sensitive detector circuit, the combination comprising first, second, third and fourth impedance elements connected in a series loop, said first and third impedance elements having operating characteristics such that impedance to conductivity of current of one polarity is relatively low and impedance to conductivity of current of an opposite polarity is relatively high; said second and fourth impedance elements having operating characteristics such that impedance to conductivity of current of said opposite polarity is relatively low and impedance to conductivity of current of said one polarity is relatively high; first and second alternating current signal sources; a load; said load and said sources being connected in a first conducting path with said first and third impedance elements and in a second conducting path with said second and fourth impedance elements; a first non-linear impedance device in said first conducting path, said first non-linear impedance device comprising a diode amplifier having operating characteristics such that its impedance is relatively high to conductivity of current of said one polarity until said current exceeds a predetermined value, after which its impedance is relatively low; a second non-linear impedance device in said second conducting path, said second non-linear impedance device comprising a diode amplifier having operating characteristics such that its impedance is relatively high to conductivity of current of said opposite polarity until said current exceeds a predetermined value, after which its impedance is relatively low.

3. In a balanced diode type of signal-sensitive detector circuit, the combination comprising: first, second, third and fourth impedance elements connected in a series loop, said first and third impedance elements having operating characteristics such that impedance to conductivity of current of one polarity is relatively low and impedance to conductivity of current of an opposite polarity is relatively high, said second and fourth impedance elements having operating characteristics such that impedance to conductivity of current of said opposite polarity is relatively low and impedance to conductivity of current of said one polarity is relatively high; first and second alternating current signal sources; a load; said load being connected in a first and a second conducting path, said first conducting path constituting said first source, said first impedance element, said second source, said third impedance element, and said load in series; said second conducting path constituting said first source, said fourth impedance element, said second source, said second impedance element, and said load in series; a first non-linear impedance device connected in said first conducting path, said first non-linear impedance device comprising a diode amplifier having operating characteristics such that its impedance is relatively high to conductivity of current of said one polarity until said current exceeds a predetermined value, after which its impedance is relatively low; and a second non-linear impedance device connected in said second conducting path, said second non-linear impedance device comprising a diode amplifier having operating characteristics such that its impedance is relatively high to conductivity of current of said opposite polarity until said current exceeds a predetermined value, after which its impedance is relatively low.

4. In a balanced diode type of phase-sensitive detector circuit, the combination comprising: first, second, third and fourth impedance elements connected in a series loop, said first and third impedance elements having operating characteristics such that impedance to conductivity of current of one polarity is relatively low and impedance to conductivity of current of an opposite polarity is relatively high, said second and fourth impedance elements having operating characteristics such that impedance to conductivity of current of said opposite polarity is relatively low and impedance to conductivity of current of said one polarity is relatively high; first and second alternating current signal sources; a load; said load being shunted by a first and a second conducting path; said first conducting path constituting said first source, said first impedance element, said second source, and said third impedance element; said second conducting path constituting said first source, said fourth impedance element, said second source, and said second impedance element; a first non-linear impedance device connected in said first conducting path, said first non-linear impedance device comprising a diode amplifier having operating characteristics such that its impedance is relatively high to conductivity of current of said one polarity until said current exceeds a predetermined value, after which its impedance is relatively low; and a second non-linear impedance device connected in said second conducting path, said second non-linear impedance device comprising a diode amplifier having operating characteristics such that its impedance is relatively high to conductivity of current of said opposite polarity until said current exceeds a predetermined value, after which its impedance is relatively low.

5. In a balanced diode type of phase sensitive detector circuit, the combination comprising: first, second, third and fourth impedance elements connected in a series loop, said first and third impedance elements having operating characteristics such that impedance to conductivity of current of one polarity is relatively low and impedance to conductivity of current of an opposite polarity is relatively high, said second and fourth impedance elements having operating characteristics such that impedance to conductivity of current of said opposite polarity is relatively low and impedance to conductivity of current of said one polarity is relatively high; first and second alternating current signal sources; a load; said load being connected in a first and a second conducting path; said first conducting path constituting said first and second sources in parallel, said first impedance element, said load, and said third impedance element; said second conducting path constituting said first and second sources in parallel, said second impedance element, said load, and said fourth impedance element; a first non-linear impedance device connected in said first conducting path, said first non-linear impedance device comprising a diode amplifier having operating characteristics such that its impedance is relatively high to conductivity of current of said one polarity until said current exceeds a predetermined value, after which its impedance is relatively low; and a second non-linear impedance device connected in said second conducting path, said second non-linear impedance device comprising a diode amplifier having operating characteristics such that its impedance is relatively high to conductivity of current of said opposite polarity until said current exceeds a predetermined value, after which its impedance is relatively low.

6. The combination comprising: first, second, third and fourth unidirectional conduction devices connected to form a balanced diode type of phase-sensitive detector, said detector having two pairs of input terminals; a first alternating current source connected to one pair of said terminals; a second alternating current source connected to the remaining pair of input terminals; an output utilization network for said detector; said first and third unidirectional conduction devices being poled to constitute a first path for currents of one polarity from said sources through said load, said second and fourth unidirectional conduction devices being poled to constitute a second path for currents of opposite polarity from said source through said load; a first zener diode amplifier connected in said first path to oppose conduction of said currents of one polarity until the voltage across said first zener diode exceeds a predetermined value, whereupon the impedance of said first zener diode is reduced to permit conduction of said currents; and a second zener diode amplifier connected in said second path to oppose said currents of opposite polarity until the voltage across said second zener diode exceeds a predetermined value, whereupon the impedance of said second zener diode is reduced to permit conduction of said currents of opposite polarity.

References Cited in the file of this patent

UNITED STATES PATENTS

| | | |
|---|---|---|
| 2,510,075 | Clavier et al. | June 6, 1950 |
| 2,854,651 | Kircher | Sept. 30, 1958 |